US010619239B2

(12) United States Patent
Pocius et al.

(10) Patent No.: US 10,619,239 B2
(45) Date of Patent: Apr. 14, 2020

(54) METHOD AND SYSTEM FOR PREPARING POLYCRYSTALLINE GROUP III METAL NITRIDE

(71) Applicant: SLT Technologies, Inc, Los Angeles, CA (US)

(72) Inventors: Douglas W. Pocius, Santa Barbara, CA (US); Derrick S. Kamber, Goleta, CA (US); Mark P. D'Evelyn, Santa Barbara, CA (US); Jonathan D. Cook, Santa Barbara, CA (US)

(73) Assignee: SLT TECHNOLOGIES, INC., Los Angeles, CA (US)

( * ) Notice: Subject to any disclaimer, the term of this patent is extended or adjusted under 35 U.S.C. 154(b) by 0 days.

(21) Appl. No.: 16/023,137

(22) Filed: Jun. 29, 2018

(65) Prior Publication Data

US 2018/0371609 A1 Dec. 27, 2018
US 2019/0161858 A9 May 30, 2019

Related U.S. Application Data

(63) Continuation of application No. 15/011,266, filed on Jan. 29, 2016, now Pat. No. 10,094,017.
(Continued)

(51) Int. Cl.
*C23C 16/448* (2006.01)
*C23C 16/30* (2006.01)
(Continued)

(52) U.S. Cl.
CPC ........ *C23C 16/303* (2013.01); *C01B 21/0632* (2013.01); *C23C 16/01* (2013.01);
(Continued)

(58) Field of Classification Search
CPC combination set(s) only.
See application file for complete search history.

(56) References Cited

U.S. PATENT DOCUMENTS 6,406,540 B1 6/2002 Harris et al.
6,656,615 B2 12/2003 Dwilinski et al.
(Continued)

FOREIGN PATENT DOCUMENTS

JP 2014-118327 A 6/2014
JP 2014-139118 A 7/2014
(Continued)

OTHER PUBLICATIONS

M. Mynbaeva et al. Internet Journal Nitride Semiconductor Research Strain Relaxation in GaN Layers Grown on Porous GaN Sublayers. (1999) Res. 4, 14.
(Continued)

*Primary Examiner* — Erin F Bergner
(74) *Attorney, Agent, or Firm* — Patterson & Sheridan, LLP

(57) ABSTRACT

A process of preparing polycrystalline group III nitride chunks comprising the steps of (a) placing a group III metal inside a source chamber; (b) flowing a halogen-containing gas over the group III metal to form a group III metal halide; (c) contacting the group III metal halide with a nitrogen-containing gas in a deposition chamber containing a foil, the foil comprising at least one of Mo, W, Ta, Pd, Pt, Ir, or Re; (d) forming a polycrystalline group III nitride layer on the foil within the deposition chamber; (e) removing the polycrystalline group III nitride layer from the foil; and (f) comminuting the polycrystalline group III nitride layer to form the polycrystalline group III nitride chunks, wherein the removing and the comminuting are performed in any order or simultaneously.

21 Claims, 6 Drawing Sheets

Related U.S. Application Data

(60) Provisional application No. 62/109,498, filed on Jan. 29, 2015, provisional application No. 62/109,513, filed on Jan. 29, 2015.

(51) Int. Cl.

| | | |
|---|---|---|
| *C23C 16/44* | (2006.01) | |
| *C30B 7/10* | (2006.01) | |
| *C30B 29/40* | (2006.01) | |
| *C23C 16/01* | (2006.01) | |
| *C01B 21/06* | (2006.01) | |

(52) U.S. Cl.
CPC ...... *C23C 16/4401* (2013.01); *C23C 16/4488* (2013.01); *C30B 7/105* (2013.01); *C30B 29/406* (2013.01); *C01P 2004/60* (2013.01); *C01P 2004/90* (2013.01); *C01P 2006/80* (2013.01)

(56) References Cited

U.S. PATENT DOCUMENTS

| | | |
|---|---|---|
| 7,063,741 B2 | 6/2006 | D'Evelyn et al. |
| 7,078,731 B2 | 7/2006 | D'Evelyn et al. |
| 7,125,453 B2 | 10/2006 | D'Evelyn et al. |
| 7,335,262 B2 | 2/2008 | Dwilinski et al. |
| 7,381,391 B2 | 6/2008 | Spencer et al. |
| 7,932,382 B2 | 4/2011 | Wang et al. |
| 7,935,382 B2 | 5/2011 | Park et al. |
| 8,039,412 B2 | 10/2011 | Park et al. |
| 8,097,081 B2 | 1/2012 | D'Evelyn |
| 8,461,071 B2 | 6/2013 | D'Evelyn |
| 8,858,708 B1 | 10/2014 | Callahan |
| 8,987,156 B2 | 3/2015 | D'Evelyn et al. |
| 2002/0175403 A1 | 11/2002 | Sreeram |
| 2006/0037529 A1 | 2/2006 | D'Evelyn et al. |
| 2006/0177362 A1 | 8/2006 | D'Evelyn et al. |
| 2007/0141819 A1 | 6/2007 | Park et al. |
| 2007/0142204 A1 | 6/2007 | Park et al. |
| 2007/0151509 A1 | 7/2007 | Park et al. |
| 2008/0193363 A1 | 8/2008 | Tsuji |
| 2009/0301388 A1 | 12/2009 | D'Evelyn |
| 2010/0126411 A1 | 5/2010 | Letts et al. |
| 2010/0285657 A1 | 11/2010 | Hashimoto et al. |
| 2012/0021175 A1 | 1/2012 | Moody |
| 2013/0251615 A1 | 9/2013 | D'Evelyn et al. |

FOREIGN PATENT DOCUMENTS

| | | |
|---|---|---|
| JP | 2014-189426 A | 10/2014 |
| JP | 2014-227314 A | 12/2014 |

OTHER PUBLICATIONS

Wang et al. Journal of Crystal Growth 286 (2006) 50-54, "Synthesis of Dense Polycrystaline GaN of High Purity by the Chemical Vapor Reaction Process".

Callahan et al., "Synthesis and Growth of Gallium Nitride by the Chemical Vapor Reaction Process (CVRP)", MRS Internet Journal Nitride Semiconductor Research, vol. 4, 10 (1999).

D'Evelyn et al., "Bulk GaN crystal growth by the high-resssure ammonothermal method", "Journal of Crystal Growth", vol. 300 (2007), pp. 11-16.

Dwilinski et al., "Excellent crystallinity of truly bulk ammonothermal GaN", "Journal of Crystal Growth", vol. 310 (2008), pp. 3911-3916.

Fukuda et al., "Prospects for the ammonothermal growth of large GaN crystal", "Journal of Crystal Growth", vol. 305 (2007), pp. 304-310.

Wang et al., "Ammonothermal Synthesis of III-Nitride Crystals", Crystal Growth & Design, vol. 6, pp. 1227-1246 (2006).

METHOD AND SYSTEM FOR PREPARING POLYCRYSTALLINE GROUP III METAL NITRIDE

REFERENCE TO RELATED APPLICATIONS

This application is a continuation of U.S. patent application Ser. No. 15/011,266, filed on Jan. 29, 2016, which is based upon and claims priority to U.S. Provisional Application No. 61/109,498, filed on Jan. 29, 2015, and U.S. Provisional Application No. 62/109,513, filed on Jan. 29, 2015, the entire contents of each application are herein incorporated by reference.

GOVERNMENT LICENSE RIGHTS

This invention was made with partial government support Cooperative Agreement DE-AR0000020, awarded by the U.S. Advanced Research Projects Agency Energy. The government has certain right in the invention.

FIELD OF INVENTION

The present disclosure generally relates to processing of materials for growth of crystals. More particularly, the present disclosure provides a crystalline nitride material suitable for use as a raw material for crystal growth of a gallium-containing nitride crystal by an ammonobasic or ammonoacidic technique, but there can be others.

BACKGROUND

Group III nitride containing crystalline materials serve as substrates for manufacture of optoelectronic devices such as violet or blue light emitting diodes and laser diodes and electronic devices such as diodes and switches. Such optoelectronic and electronic devices have been commonly manufactured on sapphire, silicon, or silicon carbide substrates that differ in composition from the deposited nitride layers. The use of Group III nitride substrates can provide a number of benefits, including increased performance and lifetime.

Most bulk GaN substrates today are manufactured by hydride vapor phase epitaxy (HVPE), a vapor phase technique that deposits a thick layer of GaN on a substrate, typically sapphire or gallium arsenide. To date, HVPE substrates have been relatively expensive, and the crystalline quality may be insufficient for certain applications, such as high performance laser diodes or vertical GaN-on-GaN power electronic devices.

Superior crystalline quality has been demonstrated by true bulk crystal growth techniques, including ammonothermal crystal growth. Ammonothermal crystal growth methods are expected to be scalable, as described by Dwiliński, et al., *Excellent crystallinity of truly bulk ammonothermal GaN*, Journal of Crystal Growth, Vol. 310, pp. 3911-3916 (2008), by Fukuda, et al., *Prospects for the ammonothermal growth of large GaN crystal*, Journal of Crystal Growth, Vol. 305, pp. 304-310 (2007), by D'Evelyn, et al., *Bulk GaN crystal growth by the high-pressure ammonothermal method*, Journal of Crystal Growth, Vol. 300, pp. 11-16 (2007), and by Wang, et al., *Ammonothermal Synthesis of III-Nitride Crystals*, Crystal Growth & Design, Vol. 6, pp. 1227-1246 (2006). The ammonothermal method generally requires a polycrystalline nitride raw material, which is then recrystallized onto seed crystals.

An ongoing challenge of certain ammonothermally-grown GaN crystals is a significant level of impurities, which cause the crystals to be colored, e.g., yellowish, greenish, grayish, or brownish. The residual impurities may cause optical absorption in light emitting diodes fabricated on such substrates, negatively impacting efficiency, and may also affect the electrical conductivity and/or generate stresses within the crystals. One source of the impurities is the polycrystalline group III nitride raw material. In addition, the polycrystalline GaN nutrient must be inexpensive if the GaN crystals grown from it are to be inexpensive, and therefore the synthesis process must be scalable to large volumes, efficient, and cost-effective.

Several methods for synthesis of polycrystalline group III nitride materials have been proposed. Callahan, et al., *Synthesis and Growth of Gallium Nitride by the Chemical Vapor Reaction Process (CVRP)*, MRS Internet Journal of Nitride Semiconductor Research, Vol. 4, e10 (1999) and U.S. Pat. No. 6,406,540 proposed a chemical vapor reaction process involving heating gallium metal in a vapor formed by heating $NH_4Cl$. Related conversion-in-place methods have been discussed by Wang, et al., *Synthesis of dense polycrystalline GaN of high purity by the chemical vapor reaction process*, Journal of Crystal Growth, Vol. 286, pp. 50-54 (2006), by Callahan, et al., U.S. Pat. No. 8,858,708 and by Park, et al. U.S. Patent Publication Nos. 2007/0142204, 2007/0151509, and 2007/0141819]. In the case of Park, the predominant impurity observed was oxygen, at levels varying from about 16 to about 160 parts per million (ppm). The chemical form of the oxygen was not specified. An alternative method, involving heating in ammonia only and producing GaN powder with an oxygen content below 0.07 wt %, was disclosed by Tsuji, U.S. Patent Publication No. 2008/0193363. Yet another alternative method, involving contacting Ga metal with a wetting agent such as Bi and heating in ammonia only, producing GaN powder with an oxygen content below 650 ppm, has been disclosed by Spencer, et al., U.S. Pat. No. 7,381,391. Other methods involve downstream synthesis of polycrystalline GaN, that is, where the material is deposited downstream from a source of gallium metal. Examples of downstream synthesis processes have been disclosed by Hashimoto, et al., U.S. Patent Publication No. 2010/0285657, by Letts, et al., U.S. Patent Publication No. 2010/0126411, and by Kubota, Saito, and Nagaoka, Japanese Patent Publication Nos. 2014-118327, 2014-139118, 2014-189426, and 2014-227314. D'Evelyn, et al., U.S. Pat. Nos. 8,461,071 and 8,987,156, disclosed the deliberate addition of a getter composition to a polycrystalline group III nitride.

These methods, whether conversion-in-place, powder, or downstream synthesis, suffer from various shortcomings, as described further below. What is needed is a method for scalable, efficient, low-cost manufacturing of polycrystalline nitride materials that are suitable for crystal growth of bulk gallium nitride crystals and do not contribute excess impurities to the bulk crystals. The present invention fulfills this need among others.

SUMMARY OF INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention relates to method and system for scalable, efficient, low-cost manufacturing of high purity, polycrystalline nitride materials. In one embodiment, the present invention relates to a reactor having non-leak-tight couplings to non-oxide-containing components to minimize contamination of the polycrystalline nitride material. Specifically, Applicant recognizes that a main source of impurities commonly found in polycrystalline group III nitrides originates from the material constituting the reaction chambers. For example, a common reactor material is quartz, due to its toughness and workability—e.g., it can be welded readily to form leak proof joints and couplings. However, quartz chambers may be a significant source of impurities, such as oxygen content present as a group III oxide or as a substitutional impurity or silicon present as a substitutional impurity, within the polycrystalline group III nitride. These impurities can be reduced by making the reaction chambers from non-oxide-containing components, such as pyrolytic boron nitride, instead of quartz. While the use of such materials is generally not favored because they are not readily welded to form leak-tight seals, Applicant have avoided the welding problem by allowing for non-leak-tight joints. Specifically, Applicants do not attempt to weld the non-oxide-containing components, but rather envelop them in an outer "shell" (e.g. quartz) to contain any leaks. Thus, the reaction and containment functions are split between the non-oxide-containing components and the outer shell to optimize each function.

Additionally, in one embodiment, the invention relates to an inert foil deposition surface to facilitate large-scale manufacturability of polycrystalline GaN. Applicants have discovered, surprisingly, that certain metal compositions, comprising at least one of Mo, W, Ta, Pd, Pt, Ir, or Re, remain chemically inert to the synthesis process, and polycrystalline GaN deposited on them can be removed easily and without apparent contamination. The inertness of Mo, W, Ta, Pd, Pt, Ir, or Re, and particularly Mo and W, in the manufacture of polycrystalline GaN is surprising because thermodynamic calculations predict that they should convert to the nitrides $Mo_2N$ and $W_2N$, respectively, under GaN synthesis process conditions. In addition, the relatively poor adhesion of polycrystalline GaN to these compositions is surprising, given that polycrystalline GaN adheres tightly to virtually all compositions that had been explored previously. The ability to use metal foils in the growth environment, specifically, the deposition chamber, conveys several significant advantages, relative to the prior art: (1) the foil can be folded into a shape with a significantly higher surface area, providing for more efficient deposition of a polycrystalline group III nitride; (2) the foil can be used as an inexpensive, single-use part, avoiding the need to replace expensive deposition surfaces; and (3) the polycrystalline group III nitride can be recovered by simply peeling the foil off after removal from the deposition chamber.

Accordingly, one aspect of the invention is a method of preparing a polycrystalline group III nitride using a foil deposition surface comprising at least one of Mo, W, Ta, Pd, Pt, Ir, or Re. In one embodiment, the method comprises: (a) placing a group III metal inside a source chamber; (b) flowing a halogen-containing gas over the group III metal to form a group III metal halide; (c) contacting the group III metal halide with a nitrogen-containing gas in a deposition chamber containing a foil, the foil comprising at least one of Mo, W, Ta, Pd, Pt, Ir, or Re; (d) forming a polycrystalline group III nitride layer on the foil within the deposition chamber; (e) removing the polycrystalline group III nitride layer from the foil; and (f) comminuting the polycrystalline group III nitride layer to form the polycrystalline group III nitride chunks, wherein the removing and the comminuting are performed in any order or simultaneously.

Another aspect of the invention is the product made from the method above. In one embodiment, the product comprises a chunk of polycrystalline group III nitride having a wurtzite-structure, a diameter between 1 millimeter and 50 millimeters, at least one smooth surface having a root-mean-square roughness between 0.001 millimeter and 1 millimeter, the smooth surface having a maximum radius of curvature less than 100 meters.

Yet another aspect of the invention is a reactor having non-leak-tight couplings to non-oxide-containing components. In one embodiment, the reactor comprises: (a) an outer enclosure; (b) at least one source chamber within the outer enclosure; (c) at least one deposition chamber within the outer enclosure and coupled to the source chamber by at least one non-leak-tight-joint; (d) wherein at least one of the source chamber and the deposition chamber comprise a non-oxide-containing material; (e) at least one first inlet line for a halogen-containing gas coupled to the source chamber by a non-leak-tight-joint; (f) at least one second inlet line for a nitrogen-containing gas coupled to the deposition chamber by a non-leak-tight-joint; and (g) at least one third inlet line for a purge gas in fluid communication with the space between the outer enclosure and the source and deposition chambers and configured such that any gas leaking from the non-leak-tight-joints is entrained by the purge gas.

Still another aspect of the invention is a method of using the reactor described above. In one embodiment, the method comprises: (a) placing a group III metal inside the source chamber; (b) flowing a halogen-containing gas through the a first inlet line over the group III metal to form a group III metal halide and to transport the group III metal halide from the source chamber to the deposition chamber; (c) flowing a nitrogen-containing gas through the a second inlet line to contact the group III metal halide in the deposition chamber; (d) forming a polycrystalline group III nitride layer on a deposition surface within the deposition chamber; (e) removing the polycrystalline group III nitride layer from the deposition surface; and (f) comminuting the polycrystalline group III nitride layer to form polycrystalline group III nitride chunks, wherein the removing and the comminuting steps are performed in any order or simultaneously.

A further aspect of the invention is the product made using the method above. In one embodiment, the product are chunks of polycrystalline group III nitride wherein each of the polycrystalline group III nitride chunks has a concentration of oxygen as a group III oxide or as a substitutional impurity less than about 3 parts per million, and a concentration of silicon present as a substitutional impurity less than about 3 parts per million.

In other embodiments, the present disclosure provides methods suitable for synthesis of polycrystalline nitride materials, but it would be recognized that other crystals and materials can also be processed. Such crystals and materials include, but are not limited to, GaN, AlN, InN, InGaN, AlGaN, and AlInGaN, and others for manufacture of bulk or patterned single-crystal wafers or substrates. Such substrates can be used for a variety of applications including optoelectronic devices, lasers, light emitting diodes, solar cells, photoelectrochemical water splitting and hydrogen generation, photodetectors, integrated circuits, and transistors, among other devices.

DETAILED DESCRIPTION

Figure 1:
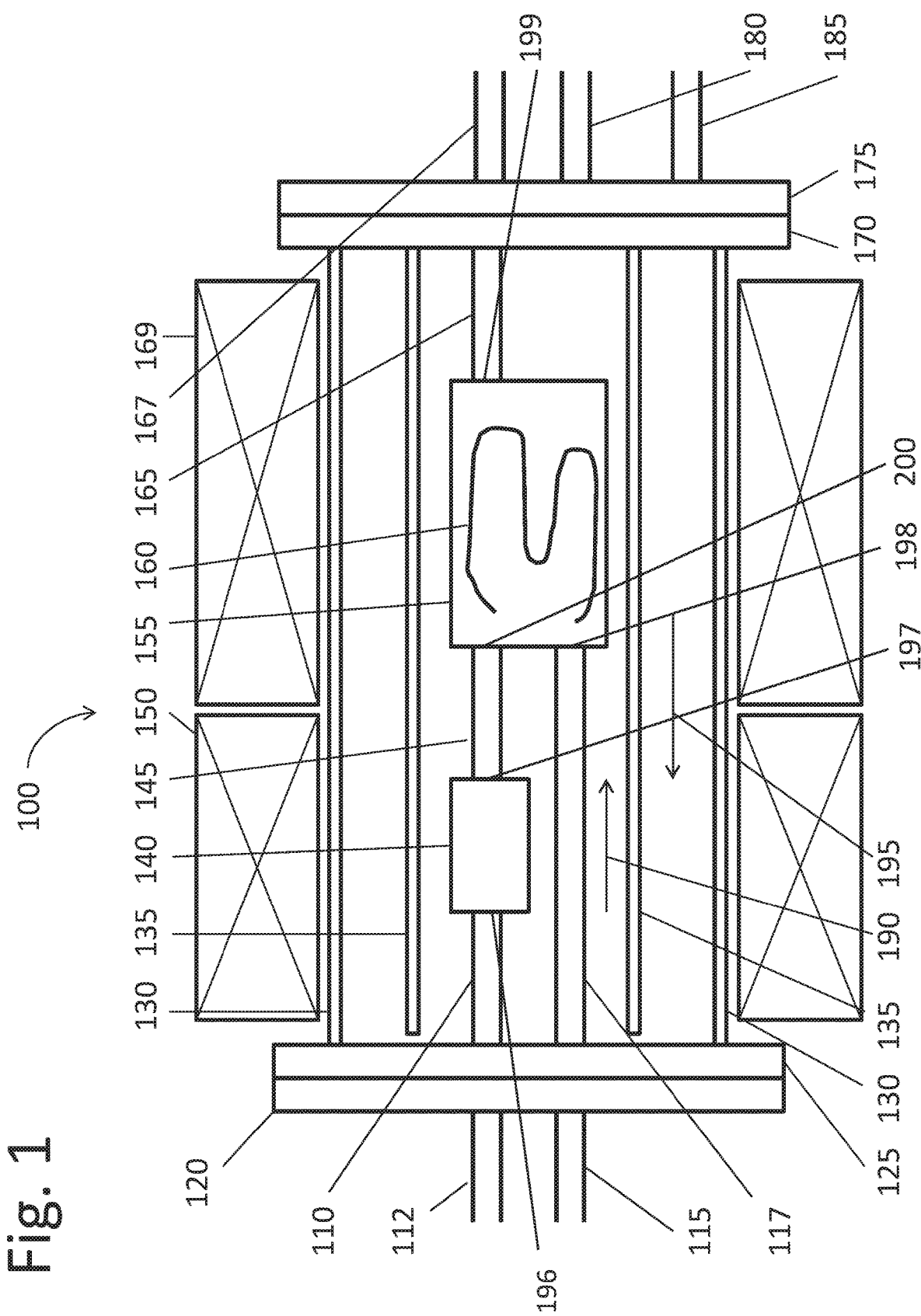
FIG. 1 is a schematic diagram illustrating a reactor according to an embodiment of the present disclosure.

The inventors have discovered various shortcomings of previous methods for synthesizing polycrystalline group III nitrides, or polycrystalline GaN in particular. GaN powder is typically unsuitable for use as a nutrient for ammonothermal crystal growth, for at least two reasons. First, powders are more susceptible to the presence of oxides, moisture, and other impurities by virtue of their relatively high surface area. Second, it is difficult to maintain a suitable fluid flow through a bed of GaN powder, where the fluid is able to freely pass between GaN particles and the GaN particles remain in place without becoming entrained in the fluid flow.

The inventors have found that the morphology of polycrystalline GaN formed by conversion-in-place processes, in which a thick GaN plate is formed overlying a pool of liquid Ga, is very sensitive to the process conditions, including the ratio of a halogen-containing gas and ammonia. These gases have widely differing molecular weights and densities, so it is difficult to keep them well mixed at the low overall gas flow velocities that are optimum for material utilization efficiency. As a result, the process is difficult to scale up and to control. In addition, by its nature the conversion-in-place process generates polycrystalline GaN that is somewhat porous, comprising a plurality of through-holes or through-pores, as Ga must be transported through these pores in order for the process to proceed. This residual porosity may entrap contaminants, such as oxides, moisture, dust, particulates, or oils, which may compromise a subsequent crystal growth process utilizing this material as a nutrient. Furthermore, the through-holes or through-pores that Ga must be transported through during this process make full conversion of the Ga difficult. If full Ga to GaN conversion does not occur, contamination of the ammonothermal process with oxygen can be an issue since the unreacted Ga readily reacts to form a Ga-oxide when exposed to an oxygen containing environment.

In the case of downstream synthesis processes, multiple chambers within a reactor are typically required, for example, a source chamber in which a halogen-containing gas flows above molten gallium to form a gaseous gallium halide, and a deposition chamber in which a nitrogen-containing gas (typically ammonia) is mixed with the gaseous gallium halide. These chambers are commonly synthesized from fused quartz, which is inexpensive, easy to fabricate, and leak-tight joints can be fabricated by welding, but can contribute both Si and O contamination to the resulting polycrystalline GaN. In addition, polycrystalline GaN deposits on quartz surfaces can be difficult to remove and, because of a large difference in the thermal expansion coefficients of the two materials, the quartz can crack. Other container materials, such as boron nitride, have been disclosed but fabrication with these materials is more difficult and the inventors are unaware of disclosure of suitable means for forming joints that do not compromise process performance. Downstream deposition has generally been performed on surfaces that are either flat, such as the top surface of a susceptor, or cylindrical, such as the perimeter of a susceptor or the inner diameter of a vessel wall. Materials of construction for the deposition surfaces have included quartz, graphite, silicon carbide, SiC- or C-coated graphite, boron nitride, and silicon nitride, all of which are rigid and from which removal of polycrystalline GaN deposits can be difficult.

Applicants disclose several innovations to the reactor design that address the limitations of previous downstream processes for synthesis of polycrystalline GaN. Referring to FIG. 1, a reactor 100 may comprise an outer enclosure 130 and demountable inlet flanges 120 and 125 and demountable outlet flanges 170 and 175. Outer enclosure 130 may comprise quartz, but other compositions are possible, including silicon carbide, boron nitride, or an alloy comprising at least one of iron, nickel, cobalt, titanium, chromium, and molybdenum. A portion of outer enclosure 130 may be surrounded by a furnace, which may comprise independent source hot zone 150 and deposition hot zone 169 and, optionally, additional hot zones (not shown), each of which may comprise heating elements and insulation, as are well known in the art. Demountable flanges 120, 125, 170, and 175 may be fabricated from stainless steel and may be water-cooled. Gas- and vacuum-tight seals between flanges 120 and 125 and between flanges 170 and 175 may be provided by one or more O-rings, optionally, with differential pumping provided between two concentric O-rings.

A halogen-containing gas may be admitted to reactor 100 through outer halogen inlet tube 112, which may comprise stainless steel or Hastelloy. The halogen-containing gas may comprise one or more of HCl, $Cl_2$, HBr, $Br_2$, HI, $I_2$, HF, $F_2$, and a carrier gas such as at least one of Ar, $N_2$, or $H_2$. In certain embodiments, dopant precursors, such as $SiH_4$, $SiCl_4$, $GeH_4$, $GeCl_4$, $H_2O$, or $Mg(C_5H_5)_2$, may be entrained in the carrier gas for inclusion in the polycrystalline composition.

The halogen-containing gas may then flow into inner halogen inlet tube 110 and into source chamber 140. Source chamber 140 may contain a group III metal, such as gallium, and reaction with the halogen-containing gas may occur, producing a volatile group III metal halide such as at least one of GaCl, $GaCl_3$, AlCl, $AlCl_3$, InCl, or $InCl_3$. In certain embodiments a secondary source chamber (not shown) is provided, into which additional halogen-containing gas is injected, so as to convert the volatile group III metal halide from a monohalide to a trihalide for more thermodynamically efficient conversion to a nitride. In certain embodiments, one or more dopants may be formed within reactor 100 by reaction of a halogen-containing gas optionally containing at least one carrier gas with a material in a source chamber. This source chamber may be source chamber 140 or a separate source chamber (not shown). Furthermore, the source chamber may be in source zone 150 or within a separate source zone (not shown). The source chamber may contain doping elements Si, Ge, O, Zn, or Mg. The dopant stream formed by chemical reaction between the halogen-containing gas with the doping elements may combine with the volatile group III metal halide flow in a source chamber (such as source chamber 140), transfer tube 145, or in deposition chamber 155. The volatile group III metal halide may then flow through transfer tube 145 into deposition chamber 155.

A nitrogen-containing gas may be admitted to reactor 100 through outer nitrogen inlet tube 115, which may comprise stainless steel, whereupon it flows through inner nitrogen inlet tube 117 into deposition chamber 155. The nitrogen-containing gas may comprise ammonia and a carrier gas such as at least one of Ar, $N_2$, or $H_2$. In certain embodiments, dopant precursors, such as $SiH_4$, $SiCl_4$, $GeH_4$, $GeCl_4$, $H_2O$, or $Mg(C_5H_5)_2$, may be entrained in the carrier gas for inclusion in the polycrystalline composition.

The halogen-containing gas and the nitrogen-containing gas may react to form polycrystalline group III nitride on surfaces within deposition chamber 155. The ratio of flow rate of the nitrogen-containing gas to the flow rate of the halogen-containing gas may be adjusted to optimize the reaction. In one embodiment, the ratio of flow rate of the nitrogen-containing gas to the flow rate of halogen-containing gas may be in a range of greater than 30:1, from about 30:1 to about 15:1, from about 15:1 to about 1:1, from about 1:1 to about 1:10, or from about 1:10 to about 1:15.

Applicants have discovered that, surprisingly, in addition to the materials of construction that have been disclosed previously, certain metal compositions remain chemically inert to the synthesis process and polycrystalline GaN deposited on them can be removed easily and without apparent contamination. Referring again to FIG. 1, deposition foil 160 may be placed within deposition chamber 155. Deposition foil 160 may comprise at least one of Mo, W, Ta, Pd, Pt, Ir, or Re. In certain embodiments, deposition foil 160 is seeded with polycrystalline group III nitride material, for example, in the form or powder, particles, or chunks, prior to flowing process gases through the reactor. The stability of the refractory metals Mo and W is surprising because thermodynamic calculations predicted that they should convert to the nitrides $Mo_2N$ and $W_2N$, respectively, under GaN synthesis process conditions. In addition, the relatively poor adhesion of polycrystalline GaN to these compositions is surprising, given that polycrystalline GaN adheres tightly to virtually all compositions that had been explored previously. The ability to use metal foils in the growth environment, specifically, the deposition chamber, conveys several significant advantages, relative to the prior art: (1) the foil can be folded into a shape with a significantly higher surface area, providing for more efficient deposition of a polycrystalline group III nitride; (2) the foil can be used as an inexpensive, single-use part, avoiding the need to replace expensive deposition surfaces; and (3) the polycrystalline group III nitride can be recovered by simply peeling the foil off after removal from the deposition chamber. The polycrystalline group III nitride can then be comminuted into chunks having the desired size distribution by cleaving, jaw-crushing, mechanical crushing, sawing, ball milling, attrition milling, or the like. In preferred embodiments, the polycrystalline group III nitride chunks have a characteristic dimension between about 1 millimeter and about 50 millimeters, or between about 2 millimeters and about 25 millimeters, or between about 3 millimeters and about 15 millimeters.

Residual gas, including carrier gas, unreacted reactant gases, and hydrogen halides resulting from the formation of polycrystalline group III nitride are exhausted from deposition chamber 155 through inner exhaust tube 165 and outer exhaust tube 167 and into a trap, where non-volatile components such as ammonium halides or group III metal halides may be removed from the gas stream.

Referring again to FIG. 1, inner halogen inlet tube 110, transfer tube 145, inner exhaust tube 165, and inner nitrogen inlet tube 117 may be coupled to source chamber 140 and deposition chamber 155 by demountable, non-leak-tight joints 196, 197, 198, 199, and 200. In some embodiments the non-leak-tight joints 196-200 comprise holes having an inner diameter that is larger, by 0.001 inch to 0.010 inch, than the tube which is inserted therein. In order to prevent contamination of the polycrystalline group III nitride synthesis process by the gas phase composition external to the non-leak-tight joints 196-200, a purge gas 190 may be flowed over the non-leak-tight joints 196-200. The purge gas 190 may comprise at least one of Ar, $N_2$, or $H_2$. The content of $O_2$ and $H_2O$ in the purge gas may each be less than 100 parts per million, less than 10 parts per million, less than 1 part per million, or less than 0.1 part per million. Flow rates may be controlled such that the pressure of the halogen-containing gas and of the nitrogen-containing gas are each greater than that of purge gas 190 so that the former leak outward into the purge gas rather than the purge gas leaking inward to source chamber 140 or deposition chamber 155.

In certain embodiments, an intermediate enclosure 135 is incorporated between outer enclosure 130 and inner halogen inlet tube 110, transfer tube 145, inner exhaust tube 165, inner nitrogen inlet tube 117, source chamber 140, and deposition chamber 155. Intermediate enclosure 135 may comprise quartz, but other compositions are possible, including silicon carbide, boron nitride, graphite, tantalum carbide, or an alloy comprising at least one of iron, nickel, cobalt, titanium, chromium, tantalum, and molybdenum. One or more passageways for gas may be incorporated into intermediate enclosure 135 proximate to inlet flange 125, permitting injection of purge gas into purge inlet 185, passage of counter-propagating purge gas 195 in the space between intermediate enclosure 135 and outer enclosure 130, forward propagation of purge gas 190 between intermediate enclosure 135 and inner halogen inlet tube 110, transfer tube 145, inner exhaust tube 165, inner nitrogen inlet tube 117, source chamber 140, and deposition chamber 155, and exit through purge exhaust 180. In certain embodiments, purge exhaust 180 and outer exhaust tube 167 may be a single exhaust pathway. The presence of intermediate enclosure 135 prevents deposition of polycrystalline group III nitride onto outer enclosure 130 and the counter-propagating purge gas 195 causes the purge gas to become heated prior to passing in the same direction as the process gases.

The outer nitrogen inlet 115 may include one or more filters, purifiers, or driers to purify and/or dry the nitrogen-containing gas. The purifier may be able to maintain purity levels of the nitrogen-containing gas up to or above semiconductor grade standards for purity. Furthermore, outer halogen inlet tube 112 may include one or more filters, purifiers, or driers to purify and/or dry the halogen-containing gas. The purifier may be able to maintain purity levels of the halogen-containing gas up to or above semiconductor grade standards for purity. Furthermore, outer nitrogen inlet 115 and outer halogen inlet tube 112 may include one or more filters, purifiers, or driers to purify and/or dry the Ar, $N_2$, or $H_2$ carrier gases used in each line.

In certain embodiments, exhaust lines 165 and 167 are maintained at a temperature of greater than about 250 degree Celsius at 1 atmosphere, or a temperature in a range of from about 250 degree Celsius to about 370 degree Celsius, or greater than about 370 degrees Celsius during operation so as to avoid premature condensation (formation) of non-volatile components such as ammonium halides.

In certain embodiments, one or more crucibles and/or raw materials are loaded into the source chamber from a glove box, dry box, desiccator, or other inert atmosphere environment. In certain embodiments, a polycrystalline group III nitride is removed from the chamber following a synthesis run directly into a glove box, dry box, desiccator, or other inert atmosphere environment. For convenience, an inert atmosphere may generally be referred to as a glove box.

In certain embodiments, reactor 100 comprises a horizontal tube furnace in which a halogen-containing gas and a nitrogen containing gas react with a group III metal to form a polycrystalline group III nitride. However, other configurations are also envisaged. In some embodiments the reactor is oriented to be vertical rather than horizontal. In some embodiments a glove box is interfaced to the reactor, so that the reactor can be opened, group III metal added, and polycrystalline group III nitride removed, without exposing the interior of the reactor to air.

Figure 3:
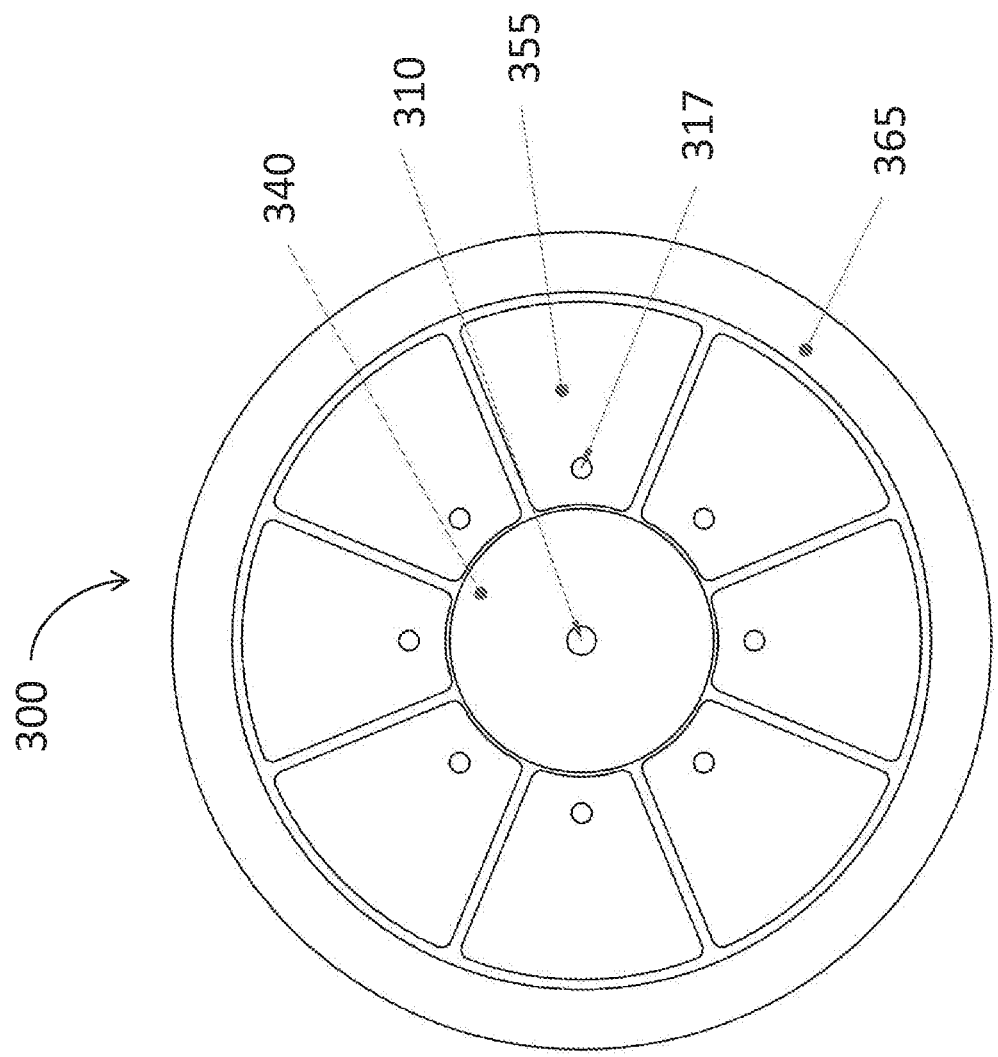
FIG. 3 is a schematic diagram illustrating a reactor according to an embodiment.

FIG. 3 is a schematic diagram of an alternative configuration for a reactor for downstream synthesis of a polycrystalline group III nitride composition. All of the prior art for synthesis of polycrystalline group III nitrides of which the current inventors are aware employs a linear configuration, in which a gas-phase metal halide synthesized in a source chamber is injected into a single, downstream deposition chamber, and then the residual gas is exhausted. In some embodiments of the present invention, effluent gas from a central source chamber 340 is dispersed radially into an azimuthally distributed, pie-shaped set of deposition chambers 355. A halogen-containing gas is injected via halogen inlet 310 into a single source chamber 340. A volatile group III halide is formed in source chamber 340 and passes through a radial array of openings or apertures into an array of deposition chambers 355. In some embodiments the openings or apertures are slit-shaped. In one embodiment the volatile group III halide passes radially from source chamber 340 into the array of deposition chambers 355 through a single annular gap between the base of the source chamber and a lid for the source chamber. The size of the opening(s) connecting source chamber 340 with deposition chambers 355 and the gas flow velocities are controlled so that negligible backstreaming of a nitrogen-containing gas into source chamber 340 occurs.

In certain embodiments a group III metal is placed into a plurality of source chambers rather than a single source chamber but the flow of volatile group III halide and carrier gas similarly passes radially into an array of deposition chambers. In certain embodiments the one or more source chambers are located at a similar level as the deposition chambers. In other embodiments the one or more source chambers are located above or below the array of deposition chambers. In each case, however, volatile group III halide is formed in the one or more source chambers and caused to flow radially into the array of deposition chambers.

A nitrogen-containing gas is injected into deposition chambers 355 though an array of nitrogen inlets 317, which then reacts with the volatile group III halide to form polycrystalline group III nitride on deposition surfaces within deposition chambers 355. In certain embodiments, metal foil (not shown) is present in deposition chambers 355 and greater than 75%, greater than 85%, greater than 90%, or greater than 95% of the deposition of polycrystalline group III nitride occurs on the metal foil.

Residual gases, including carrier gases and hydrogen halides formed by the deposition reaction pass out through an array of exhaust openings or apertures into exhaust plenum 365. In some embodiments the exhaust openings or apertures are slit-shaped. In one embodiment the residual gases pass from deposition chambers 355 into the exhaust plenum 365 through a single annular gap between the base of the deposition chambers and a lid for the deposition chambers, which may be adjoined to or a separate portion of the lid for the source chamber.

In some embodiments the reactor 300 is heated from above and below the cross section shown in FIG. 3. In some embodiments the reactor 300 is heated by a flat, annular, multi-zone heater, with independently-controlled hot zones for source zone 340 and deposition zones 355, located beneath the source zone and deposition zones, and both the upper and lower reactor enclosures (not shown) are externally cooled, with suitable insulation between the heated internal components and the cooled external enclosures.

Figure 4:
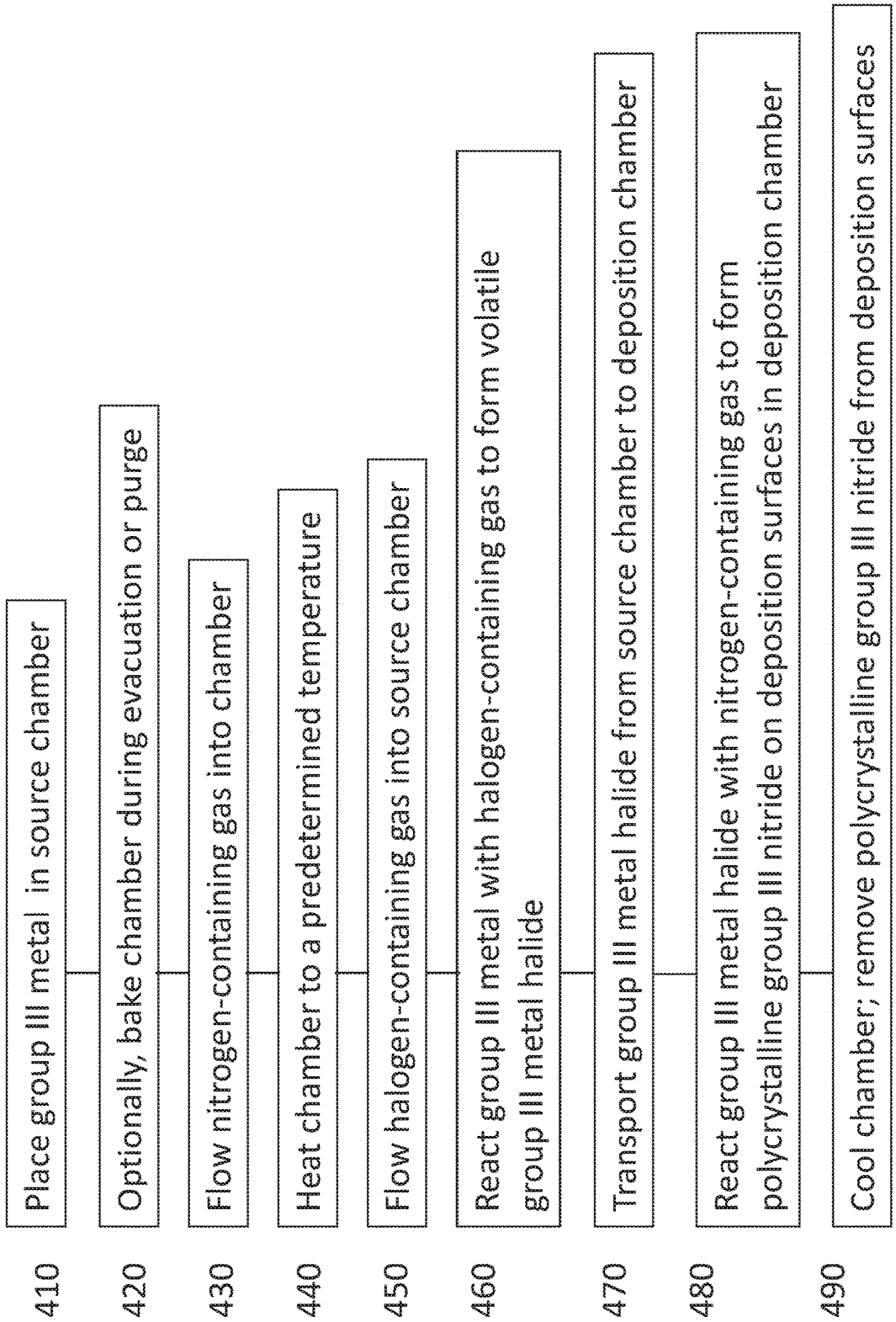
FIG. 4 is a flow chart depicting a method for preparing a polycrystalline group III metal nitride in accordance with an embodiment according to the present disclosure.

FIG. 4 is a flow chart depicting a method for preparing a polycrystalline group III nitride in accordance with certain embodiments according to the present disclosure. The method starts by providing a group III metal into a source chamber (see step 410). The source chamber, along with the rest of the reactor, is sealed, evacuated or purged and, optionally, baked to remove residual moisture or other contaminants (see step 420). A nitrogen-containing gas is flowed into the reactor, optionally along with one or more carrier gases (see step 430). The flow rate of the nitrogen-containing gas may be greater than about 250 (standard) cubic centimeters per minute. The environment in the reactor is adjusted to determined levels, including bringing the pressure to near or slightly above atmospheric pressure, for example, to a pressure between 0.8 bar and 1.2 bar. The temperature of the chamber may be heated to between about 800 degree Celsius to about 1300 degree Celsius, and the pressure within the chamber may be equal to or greater than about ambient (see step 440). In certain embodiments, the temperature of the source chamber is maintained at a lower temperature, for example, by 50 to 500 degrees Celsius, than the deposition chamber(s).

Dopants may be introduced in the chamber. The dopant may be introduced as a dopant precursor. The dopant precursor may be flowed into the chamber from a dopant source.

A halogen-containing gas may be introduced into the source chamber, where it comes into contact with a group III metal (see step 450 in FIG. 4). Optionally, the order of the preceding steps may be interchanged. The flow rate of the halogen-containing gas may be greater than about 25 cubic centimeters per minute. The ratio of the flow rate of the nitrogen-containing gas to the flow rate of the halogen-containing gas may be about 10:1.

The group III metal may react with the halogen-containing gas to form a volatile group III metal halide (see step 460), which is then transported to the deposition chamber (see step 470), where it comes into contact with the nitrogen-containing gas. The group III metal halide then reacts with the nitrogen-containing gas to form polycrystalline group III nitride on deposition surfaces within the deposition chamber (see step 480). Finally, the chamber is cooled, vented, and opened, and the polycrystalline group III nitride is removed from the deposition surfaces.

The process for synthesis of polycrystalline group III nitride is cost-effective, efficient, and scalable to large quantities. The efficiency with which halogen atoms in the halogen-containing gas are converted to group III halides may be greater than 50%, greater than 75%, greater than 85%, greater than 90%, greater than 95%, greater than 98%, or greater than 99%. The efficiency with which group III metal atoms are converted from the elemental state in the source chamber to polycrystalline group III nitride on deposition surfaces within the deposition chamber may be greater than 50%, greater than 75%, greater than 85%, greater than 90%, greater than 95%, greater than 98%, or greater than 99%.

The resultant polycrystalline group III nitride may be a metallic, semiconducting, semi-insulating or insulating material. Further, each of these compositions may be a magnetic or a luminescent material.

In one embodiment, the deposition surface is a foil as described above. Deposition of a thick polycrystalline group III nitride layer onto the metal foil, followed by removal of the metal foil and comminution of the thick polycrystalline group III nitride layer, typically produces chunks of polycrystalline group III nitride having one relatively smooth large-area surface—namely, the deposition surface from which the foil had been removed, and one relatively rough large-area surface—namely, the free growth surface that was the last to crystallize. The free growth surface is typically rough due to the random orientation of group III nitride grains that form on the deposition surface together with differences in the growth rates in different crystallographic directions, as is well known in the art.

Figure 2:
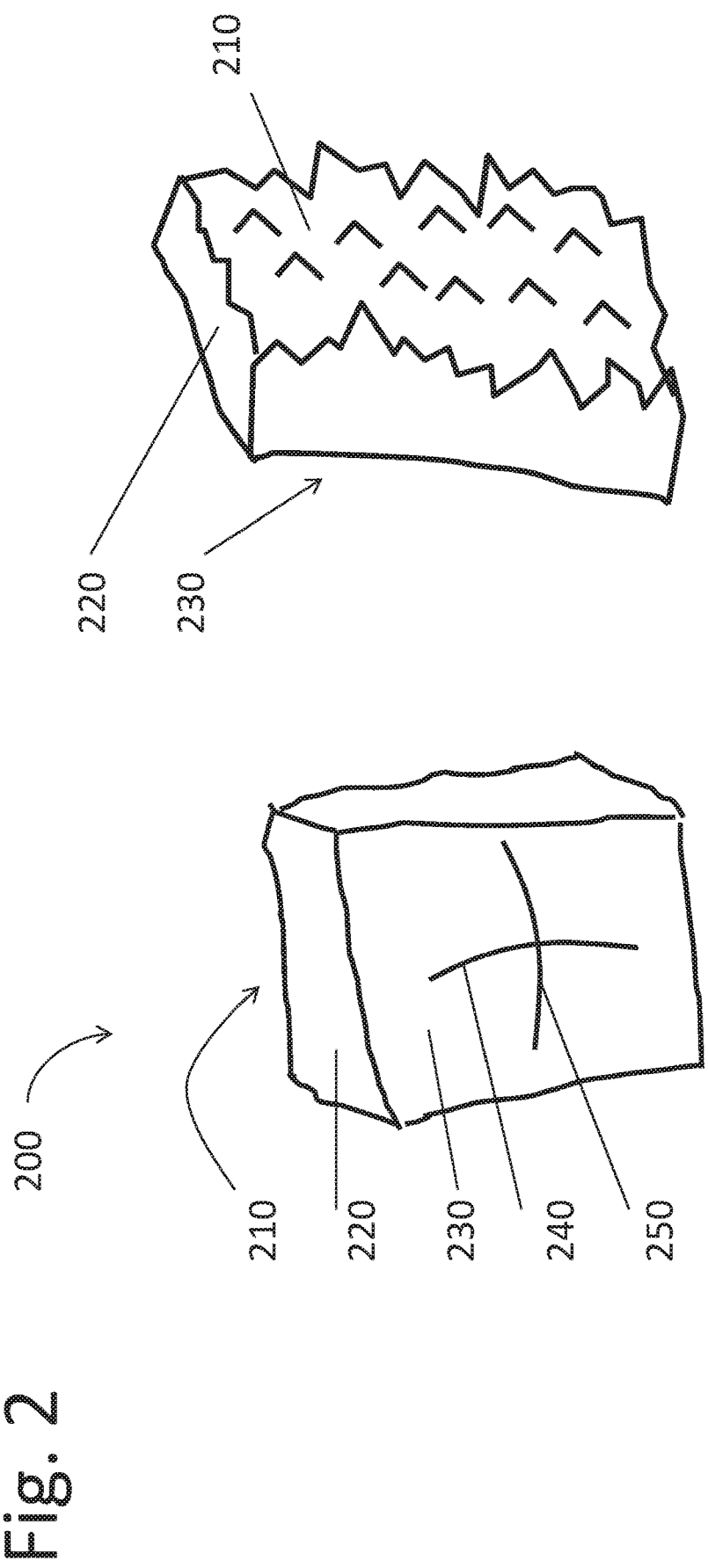
FIG. 2 is a schematic diagram of a composition of matter according to an embodiment.

Referring to FIG. 2, in one embodiment of the current invention the polycrystalline group III metal nitride chunks are characterized by having a rough growth surface 210, a relatively smooth deposition surface 230, and one or more rough fracture surfaces 220. The root-mean-square (RMS) surface roughness values of the growth surface 210, fracture surface 220, and deposition surface 230 may be between 0.5 millimeter and 10 millimeters, between 0.2 millimeter and 5 millimeters, and between 0.001 millimeter and 1 millimeter, respectively. In certain embodiments, deposition surface 230 has an RMS surface roughness between 0.02 millimeter and 0.2 millimeter.

Deposition surface 230 may be characterized by a maximum radius of curvature 240 and by a minimum radius of curvature 250. As a point of reference, if the polycrystalline group III nitride had been deposited onto a planar susceptor both the minimum and maximum radii of curvature would be essentially infinite, e.g., greater than 200 meters. If the polycrystalline group III nitride had been deposited onto a surface comprising a right circular cylinder, the minimum radius of curvature would be the radius of the cylinder, for example, between 0.01 meter and 5 meters, and the maximum radius of curvature would be essentially infinite, e.g., greater than 200 meters. In certain embodiments of the present invention, by contrast, since the polycrystalline group III nitride was deposited onto a metal foil having a somewhat irregular shape, the maximum radius of curvature 240, is between 10 millimeters and 100 meters, and the minimum radius of curvature 250 is between 1 millimeter and 5 meters. In some embodiments, after comminution the polycrystalline group III nitride comprises a plurality of chunks, wherein each chunk comprises at least one smooth surface characterized by a maximum radius of curvature and a minimum radius of curvature.

Figure 6A:
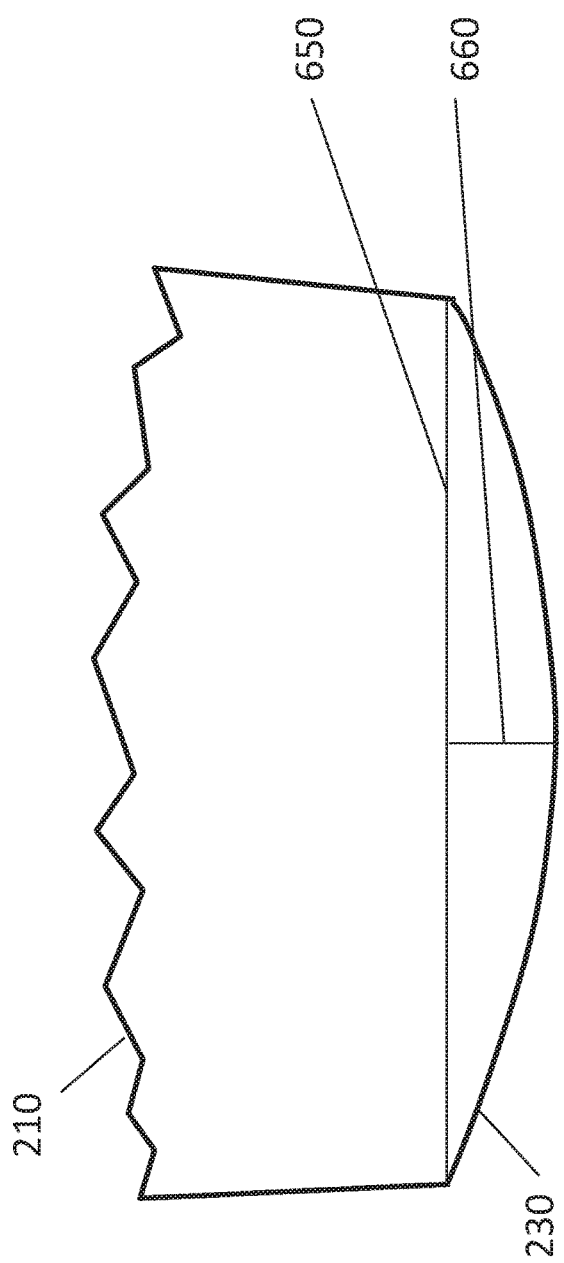
FIGS. 6A and 6B are schematic diagrams showing a method for measuring a radius of curvature according to an embodiment of the present disclosure.
Figure 6B:
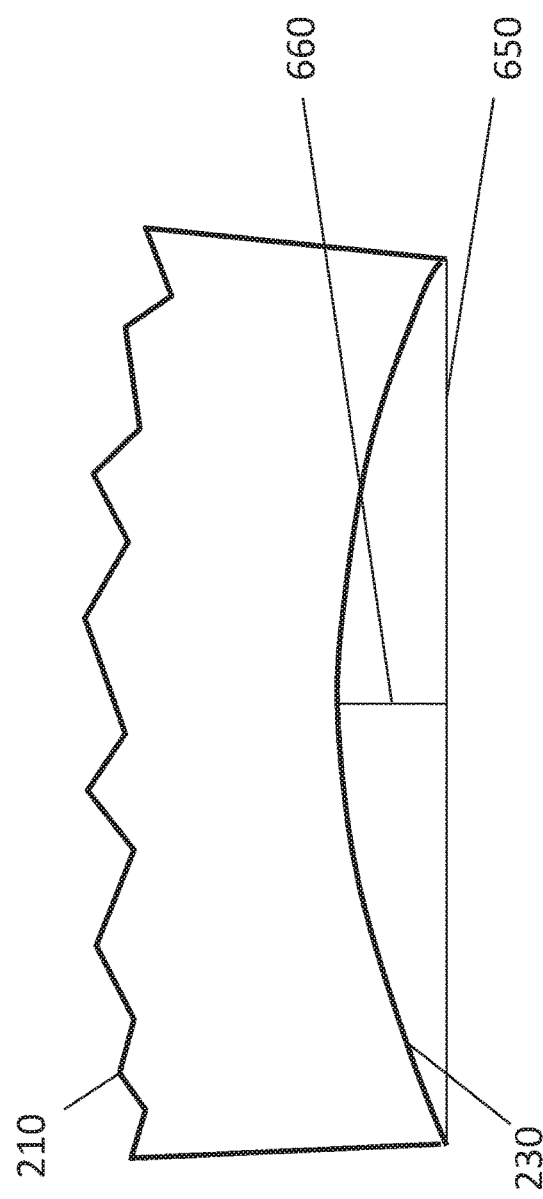

The minimum and maximum radii of curvature of a chunk are measured as follows. A section perpendicular to deposition surface 230 and growth surface 210 may intersect deposition surface 230 as a convex curve, as shown in FIG. 6A, or as a concave curve, as shown in FIG. 6B. Half-chord length 650, denoted as l, represents half the diameter of the chunk in the direction of the section. Sagitta or bow 660, denoted as s, represents the magnitude of the deviation of the deposition surface 230 from planarity in the plane of the section. Approximating the section of the deposition surface as the arc of a circle, its radius of curvature r may be calculated from equation (1):

$$r = \frac{s}{2} + \frac{l^2}{2s} \quad (1)$$

To measure the minimum radius of curvature $r_{min}$ of a chunk, the smooth surface of the chunk may be placed on a flat surface and a first sagitta $s_{min}$ measured using a ruler, calipers, or the like as the maximum distance from the flat surface, whether the smooth surface is convex or concave. A half-chord length $l_{min}$ may be measured as half the diameter of the chunk along the direction of maximum curvature and the minimum radius of curvature $r_{min}$ measured from $s_{min}$ and $l_{min}$ using equation (1).

To measure the maximum radius of curvature $r_{max}$ of a chunk, a straight edge, such as a ruler, may be placed against the smooth surface of a chuck along the direction of minimum curvature, and a second sagitta $s_{max}$ measured using a ruler, calipers, or the like as the maximum distance from the straight edge, whether the smooth surface is convex or concave. A half-chord length $l_{max}$ may be measured as half the diameter of the chunk along the direction of minimum curvature and the maximum radius of curvature $r_{max}$ measured from $s_{max}$ and $l_{max}$ using equation (1).

The minimum value and the maximum value of the minimum radii of curvature of the plurality of chunks differ from one another by at least 2 percent, by at least 5 percent, by at least 10 percent, or by at least 25 percent. Similarly, the minimum value and the maximum value of the maximum radii of curvature of the plurality of chunks differ from one another by at least 25 percent, by at least 50 percent, by at least a factor of 2, by at least a factor of 5, or by at least a factor of 10. In preferred embodiments, each of the chunks is free of through-pores.

Figure 5:
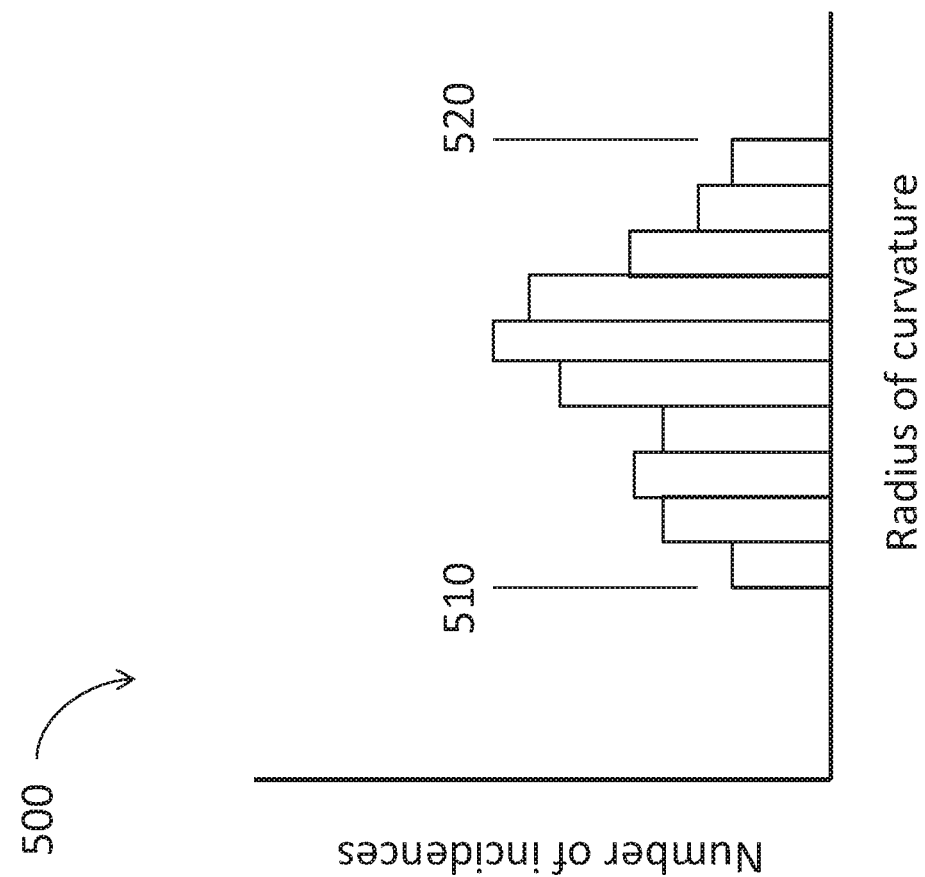
FIG. 5 is a schematic diagram showing a histogram of minimum and maximum radii of curvature according to an embodiment of the present disclosure.

Referring to FIG. 5, the minimum and maximum radius of curvature may be measured on each of a plurality of chunks of polycrystalline group III nitride and a histogram of the results may be prepared. A distribution 500 of radii of curvature may be characterized by a minimum value 510 and by a maximum value 520. Maximum value 520 may be considerably larger than minimum value 510. The distributions of the minimum radii of curvature and of the maximum radii of curvature will typically be different quantitatively but similar metrics may be used to characterize each. Alternatively, the distributions of radii of curvature may be characterized by a mean, a median, a mode, and by a standard distribution. The ratio of the standard deviation of the minimum radii of curvature divided by the mean of the minimum radii of curvature may be at least 0.02, at least 0.05, at least 0.10, or at least 0.25. The ratio of the standard deviation of the maximum radii of curvature divided by the mean of the maximum radii of curvature may be at least 0.10, at least 0.25, at least 0.50, or at least 0.75.

Achieving uniform thicknesses during growth of single-crystal group III nitrides by HVPE is generally desirable in the prior art. To the extent that similar methods have been used for downstream synthesis of polycrystalline group III nitrides, the thick films of polycrystalline group III nitrides so deposited may have a relatively uniform thickness. However, Applicants find that reactor design considerations, for example, the magnitude and direction of gas flows, temperature, reactor geometry, and the like, for maximizing raw material efficiency are rather different from those for maximizing the uniformity of film thickness. Accordingly, group III metal may be more efficiently converted to polycrystalline group III nitride if significant variations in thickness are tolerated, e.g., the polycrystalline group III nitride has a wedge shape. In certain embodiments, the maximum and minimum thickness, that is, the maximum distance between the growth surface 210 and the deposition surface 230, measured perpendicular to the deposition surface 230, may exceed the minimum distance by at least 10 percent, by at least 25 percent, by at least 50 percent, or by at least a factor of 2. In certain embodiments, the maximum thickness of a plurality of chunks of polycrystalline group III nitride is greater than the minimum thickness of a plurality of chunks of polycrystalline group III nitride by at least 25 percent, by at least 50 percent, by at least a factor of 2, by at least a factor of 5, or by at least a factor of 10.

The improved process, including the use of non-oxide-containing components and purged, non-leak-tight seals, enables the achievement of extremely pure polycrystalline group III nitride compositions even if no getter is added deliberately. In some embodiments, the concentration of adventitious impurities, such as oxygen content present as a group III oxide or as a substitutional impurity or silicon present as a substitutional impurity within the polycrystalline group III nitride may be in a range of from about 30 parts per million to about 10 parts per million, from about 10 parts per million to about 3 parts per million, from about 3 parts per million to about 1 part per million, from about 1 part per million to about 0.3 parts per million, from about 0.3 part per million to about 0.1 parts per million, or less than about 0.1 part per million.

The porosity of the polycrystalline composition may be less than about 10 percent by volume, less than about 5 percent by volume, less than about 2 percent by volume, less than about 1 percent by volume, less than about 0.3 percent by volume, or less than about 0.1 percent by volume. In some embodiments the polycrystalline composition has no measurable porosity, as measured using a technique such as mercury porosimetry, for example. In a preferred embodiment, the composition is free of through-pores or through-holes.

The polycrystalline group III nitride may have a plurality of grains, and these grains may have a columnar structure. In some embodiments, many grains may be bonded or adhered to one another, forming a polycrystalline plate. Typically, the grains adjacent to the deposition surface will be smaller in diameter than the grains adjacent to the growth surface. The diameter of the grains at the deposition surface, in a direction parallel to the deposition surface may be between about 0.01 micrometers and about 100 micrometers. The diameter of the grains at the growth surface, in a direction parallel to the growth surface, may be between about 10 micrometers and about 10 millimeters.

As used herein, the term "getter" refers to a substance that is intentionally added to a process or a composition to remove or react with undesired impurities. The getter has a higher chemical affinity for an undesired impurity, for example, oxygen, than the principal metallic constituent of the composition, for example, gallium. The getter may become incorporated into the polycrystalline group III nitride in the form of an inclusion, for example, as a metal nitride, a metal halide, a metal oxide, a metal oxyhalide, or as a metal oxynitride. Examples of suitable getters include the alkaline earth metals, boron, carbon, scandium, titanium, vanadium, chromium, yttrium, zirconium, niobium, the rare earth metals (also known as the lanthanides or the lanthanide metals), hafnium, tantalum, and tungsten, and their nitrides, oxynitrides, oxyhalides, and halides. The getter may be present in the polycrystalline group III metal nitride as a distinct phase, within individual grains of a crystalline group III metal nitride and/or at grain boundaries of a crystalline group III metal nitride, at a level greater than 100 ppm, from about 100 ppm to about 200 ppm, from about 200 ppm to about 500 ppm, from about 500 ppm to about 0.1%, from about 0.1% to about 0.2%, from about 0.2% to about 0.5%, from about 0.5% to about 2%, from about 2% to about 10%, or greater than 10%. Parts per million (ppm) and "%" refer to "by weight" unless otherwise indicated.

Getters are often used to purify the gases being used to synthesize polycrystalline gallium-containing group III nitride materials. However in these uses, the incorporation of the getter into the polycrystalline material is avoided. In contrast, some embodiments of the invention deliberately incorporate a getter phase into the polycrystalline group III nitride materials so formed. In some embodiments according to the present disclosure, a getter material is provided in a source chamber along with a group III metal. In other embodiments, a getter material is provided to a deposition chamber in which a group III metal or a group III metal halide is to be deposited. In some embodiments, the getter material, or a distinct phase comprising at least one component of the getter material, is incorporated into the polycrystalline group III metal nitride as an inclusion within or between grains of crystalline group III metal nitride. In other embodiments, the getter removes impurities from the growth environment in the gas phase and does not become incorporated into the polycrystalline group III metal nitride. In some embodiments, the getter removes impurities from the growth environment by forming a solid compound that does not become incorporated into the polycrystalline group III metal nitride. Additional features of the getter-containing composition, methods of forming, and methods use are described in U.S. Application Publication No. 2013/0251615, which is hereby incorporated by reference in its entirety.

Optionally, the polycrystalline group III metal nitride formed may be further processed. In one embodiment, the polycrystalline group III nitride formed may be further grown upon, for example, by using it as a substrate for additional growth of polycrystalline group III nitride. In one embodiment, at least one surface of the polycrystalline group III nitride may be subjected to one or more of scraping, scouring or scarifying. The as-deposited polycrystalline group III nitride may be comminuted to the desired particle size distribution by jaw crushing, ball milling, attrition milling, sieving, or other methods that are well known in the art. One or more surfaces may be further subjected to oxidation in air or in dry oxygen and it may further be heated in aqueous base to etch the surface. The residual contamination resulting from the post-processing step may be removed by washing, sonicating, or both. Washing and sonicating may be performed in, for example, organic solvents, acids, bases, oxidizers (such as hydrogen peroxide), and the like. The polycrystalline group III nitride may be annealed in an inert, nitriding, or reducing atmosphere. The annealing may also be performed in pure ammonia at a temperature of about 800 degree Celsius to about 1300 degree Celsius for a period of time in a range of from about 30 minutes to about 200 hours.

Other processing may be performed for use as a source material for crystalline composition growth. For use as a source material, the polycrystalline group III metal nitride may be pulverized into particulates or chunks. The particles may have an average diameter or characteristic dimension in a range of from about 0.3 millimeters to about 50 millimeters. The pulverizing may be carried out through, for example, compressive fracture, jaw crushing, wire sawing, ball milling, jet milling, attrition milling, laser cutting, or cryo-fracturing. Post pulverization cleaning operations may remove adventitious metal introduced by the pulverization operation, un-reacted metal, and undesirable metal oxide. Small particles or powder left over from pulverizing operations may be used to seed deposition surfaces, for examples, foil, within the deposition chamber prior to another synthesis process.

In some embodiments, the polycrystalline group III metal nitride is used as a source material for ammonothermal growth of at least one group III metal nitride single crystal. The polycrystalline group III metal nitride is placed in an autoclave or a capsule, as described in U.S. Pat. Nos. 6,656,615, 7,125,453, and 7,078,731 and in U.S. Patent Application Publication No. 2009/0301388. Ammonia and a mineralizer, for example, at least one of an alkali metal, amide, nitride, or azide, an alkaline earth metal, amide, nitride, or azide, ammonium fluoride, ammonium chloride, ammonium bromide, ammonium iodide, a group III metal fluoride, a group III metal chloride, a group III metal bromide, a group III metal iodide, or a reaction product between a group III metal, ammonia, HF, HBr, HI, and HCl are also placed in the autoclave or capsule.

After all the raw materials have been added to the autoclave or capsule, the autoclave or capsule is sealed. The capsule, if employed, is then placed within a suitable high pressure apparatus. In one embodiment, the high pressure apparatus comprises an autoclave, as described by U.S. Pat. No. 7,335,262. In another embodiment, the high pressure apparatus is an internally heated high pressure apparatus, as described in U.S. Pat. Nos. 7,125,453, 8,097,081, and in U.S. Application Publication No. 2006/0177362A1. The polycrystalline group III metal nitride is then processed in supercritical ammonia at a temperature greater than about 400 degrees Celsius and a pressure greater than about 0.02 gigaPascal (GPa), during which at least a portion of the polycrystalline group III metal nitride is etched away and recrystallized onto at least one group III nitride crystal with a wurtzite structure. In some embodiments, the polycrystalline group III metal nitride is processed in supercritical ammonia at a temperature greater than about 500 degrees Celsius, greater than about 550 degrees Celsius, greater than about 600 degrees Celsius, greater than about 650 degrees Celsius, greater than about 700 degrees Celsius, or greater than about 750 degrees Celsius. In some embodiments, the polycrystalline group III metal nitride is processed in supercritical ammonia at a pressure greater than about 0.02 GPa, greater than about 0.05 GPa, greater than about 0.1 GPa, greater than about 0.2 GPa, greater than about 0.3 GPa, greater than about 0.4 GPa, greater than about 0.5 GPa, greater than about 0.6 GPa, greater than about 0.7 GPa, or greater than about 0.8 GPa.

The ammonothermally-grown crystalline group III metal nitride may be characterized by a wurtzite structure substantially free from any cubic entities and have an optical absorption coefficient of about 2 cm-1 and less at wavelengths between about 410 nanometers and about 750 nanometers. An ammonothermally-grown gallium nitride crystal may comprise a crystalline substrate member having a length greater than about 5 millimeters, have a wurtzite structure and be substantially free of other crystal structures, the other structures being less than about 0.1% in volume in reference to the substantially wurtzite structure, an impurity concentration greater than 1014 cm-1, greater than 1015 cm-1, or greater than 1016 cm-1 of at least one of Li, Na, K, Rb, Cs, Ca, F, Br, I, and Cl, and an optical absorption coefficient of about 2 cm-1 and less at wavelengths between about 410 nanometers and about 750 nanometers. The ammonothermally-grown gallium nitride crystal may be semi-insulating, with a resistivity greater than 107 Ω-cm. The ammonothermally-grown gallium nitride crystal may be an n-type semiconductor, with a carrier concentration n between about 1016 cm-3 and 1020 cm-3 and a carrier mobility in units of centimeters squared per volt-second, such that the logarithm to the base 10 of η is greater than about −0.018557(log $1_0$n)3+1.0671(log $1_0$n)2−20.599(log $1_0$n)+135.49. The ammonothermally-grown gallium nitride crystal may be a p-type semiconductor, with a carrier concentration n between about 1016 cm-3 and 1020 cm-3 and a carrier mobility in units of centimeters squared per volt-second, such that the logarithm to the base 10 of η is greater than about −0.6546(log $1_0$n)+12.809.

By growing for a suitable period of time, the ammonothermally-grown crystalline group III metal nitride may have a thickness of greater than about 1 millimeter and a length, or diameter, greater than about 20 millimeters. In a specific embodiment, the length is greater than about 50 millimeters or greater than about 100 millimeters. The crystalline group III nitride may be characterized by crystallographic radius of curvature of greater than 1 meter, greater than 10 meters, greater than 100 meters, greater than 1000 meter, or be greater than can be readily measured (infinite). After growth, the ammonothermally-grown crystalline group III metal nitride may be sliced, lapped, polished, and chemical-mechanically polished according to methods that are known in the art to form one or more wafers or crystalline substrate members. In a specific embodiment, the root-mean-square surface roughness of the at least one wafer or crystalline substrate member is less than about one nanometer, for example, as measured by atomic force microscopy over an area of at least about 10 micrometers by 10 micrometers.

In another embodiment, the polycrystalline group III nitride is used as a source material for flux growth of at least one group III metal nitride single crystal, as described in U.S. Pat. No. 7,063,741 and in U.S. Patent Application 2006/0037529. The polycrystalline group III nitride and at least one flux are placed in a crucible and inserted into a furnace. The furnace is heated and the polycrystalline group III nitride is processed in a molten flux at a temperature greater than about 400 degrees Celsius and a pressure greater than about one atmosphere, during which at least a portion of the polycrystalline group III nitride is etched away and recrystallized onto at least one group III nitride crystal.

EXAMPLES

Embodiments provided by the present disclosure are further illustrated by reference to the following example. It will be apparent to those skilled in the art that many modifications, both to materials, and methods, may be practiced without departing from the scope of the disclosure.

Example 1

A reactor similar to FIG. 1 was constructed. The inner halogen inlet tube, source chamber, transfer tube, deposition chamber, and inner exhaust tube, were all fabricated from pyrolytic boron nitride and were coupled to one another by demountable, non-leak-tight joints. The inner nitrogen inlet tube was constructed of quartz and was similarly coupled by demountable, non-leak-tight joints. These components were placed within an intermediate enclosure fabricated from pyrolytic boron nitride, and an outer enclosure fabricated from quartz and the space between them was purged by high purity nitrogen during operation. The reactor was placed within a three-zone horizontal furnace.

791 Grams of high purity gallium metal (99.99999% pure metal basis) were placed into a pyrolytic boron nitride (pBN) source chamber inside a nitrogen ($N_2$)-filled glovebox containing less than 1 part per million each of oxygen and water. The gallium-filled source chamber was then placed within the reactor and connected to $N_2$ and chlorine ($Cl_2$) gas sources upstream from a deposition chamber made from pBN and into which a number of pieces of molybdenum foil were placed. The deposition chamber was also connected to an ammonia ($NH_3$) gas source. The reactor was evacuated and back-filled with nitrogen. The furnace temperature was then raised to 900° C. and a bake-out in $N_2$ was performed for 240 hours to remove oxygen and moisture from the furnace. After the nitrogen bake-out, gas flows were set to 0.5 L/min, 0.025 L/min, 0.4 L/min, and 6.0 L/min for $N_2$ carrier gas in the $Cl_2$ line, $Cl_2$, $NH_3$, and $N_2$ in the reactor, respectively. The process was run for 30.7 hours, the reactive gases were stopped, and the reactor was cooled. 243 Grams of gallium were transported to the deposition zone during the growth run to produce 206 grams of polyGaN, providing an 71% gallium conversion efficiency. GaN deposited in the deposition chamber primarily on a slightly curved foil deposition surface with a radius of curvature of approximately 380 mm and on a cylindrical foil surface with a radius of curvature of approximately 28 mm. GaN was removed from the surfaces and two samples from the deposition surface with a maximum radius of curvature of approximately 380 mm were analyzed by secondary ion mass spectrometry (SIMS) for oxygen on their top surfaces (the last grown surfaces). The first sample with a thickness of approximately 2.0 mm, had a measured oxygen content of 0.5 ppm, and the second sample with a thickness of 2.45 mm had a measured oxygen content of 1.0 ppm.

Approximating language, as used herein throughout the specification and claims, may be applied to modify any quantitative representation that could permissibly vary without resulting in a change in the basic function to which it may be related. Accordingly, a value modified by a term such as "about" may not be limited to the precise value specified. In at least one instance, the variance indicated by the term about may be determined with reference to the precision of the measuring instrumentation. Similarly, "free" may be combined with a term; and, may include an insubstantial number, or a trace amount, while still being considered free of the modified term unless explicitly stated otherwise.

While the above is a full description of the specific embodiments, various modifications, alternative constructions and equivalents may be used. Therefore, the above description and illustrations should not be taken as limiting the scope of the present disclosure which is defined by the appended claims.

The invention claimed is:

1. A method using a reactor, comprising:
   placing a group III metal inside a source chamber;
   flowing a halogen-containing gas over the group III metal to form a group III metal halide;
   contacting said group III metal halide with a nitrogen-containing gas in a deposition chamber containing a foil, said foil comprising at least one of Mo, W, Ta, Pd, Pt, Ir, or Re;
   forming a polycrystalline group III nitride layer on said foil within said deposition chamber, wherein the polycrystalline group III nitride layer has a first surface that is in contact with said foil and a second surface that is opposite to the first surface, and the formed polycrystalline group III nitride layer is substantially free of pores that extend between the first surface and the second surface;
   removing said polycrystalline group III nitride layer from said foil, wherein the first surface of the polycrystalline group III nitride layer has a root-mean-square roughness that is less than a root-mean-square roughness of the second surface; and
   comminuting said polycrystalline group III nitride layer to form polycrystalline group III nitride chunks, wherein said removing and said comminuting are performed in any order or simultaneously.

2. The method of claim 1, wherein said foil comprises at least one of Mo or W.

3. A method of using a reactor, comprising:
   placing a group III metal inside a source chamber, the source chamber being enclosed within an outer enclosure of the reactor;
   flowing a halogen-containing gas through a first inlet line of the reactor and over the group III metal within the source chamber to form a group III metal halide and to transport the group III metal halide from the source chamber to a deposition chamber of the reactor through a transfer tube, wherein the deposition chamber is enclosed within the outer enclosure;
   flowing a nitrogen-containing gas through a second inlet line to contact the group III metal halide in the deposition chamber;
   flowing a purge gas through a third inlet line into a space between the outer enclosure, the source chamber and the deposition chamber;
   forming a polycrystalline group III nitride layer on a deposition surface within the deposition chamber;
   removing the polycrystalline group III nitride layer from the deposition surface; and
   comminuting the polycrystalline group III nitride layer to form polycrystalline group III nitride chunks, wherein the removing and the comminuting steps are performed in any order or simultaneously, wherein
   at least one of a first joint coupling the source chamber to the transfer tube and a second joint coupling the transfer tube to the deposition chamber is non-leak-tight.

4. The method of claim 3, further comprising using said polycrystalline group III nitride chunks as a nutrient for ammonothermal crystal growth to grow a group III nitride boule and preparing one or more group III nitride wafers from said group III nitride boule.

5. The method of claim 3, wherein
   the first inlet line is coupled to the source chamber by a non-leak-tight-joint,
   the second inlet line is coupled to the deposition chamber by a non-leak-tight-joint, and
   the flowing of the purge gas through the third inlet line and into the space between the outer enclosure, the source chamber and the deposition chamber is such that any gas leaking from the non-leak-tight-joints is entrained by the purge gas.

6. The method of claim 5, wherein the reactor further comprises an intermediate enclosure configured between the outer enclosure, the source chamber and the deposition chamber, wherein the third inlet line is in fluid communication with the space between the outer enclosure and the intermediate enclosure.

7. The method of claim 3, wherein at least one of the source chamber and the deposition chamber comprise a non-oxide-containing material, the non-oxide-containing material being selected from boron nitride, silicon carbide, graphite, molybdenum, tantalum, and tungsten, and combinations thereof.

8. The method of claim 3, wherein the deposition surface comprises a foil comprising at least one of Mo, W, Ta, Pd, Pt, Ir, or Re.

9. The method of claim 3, wherein at least one of the steps of placing the group III metal in the source chamber and removing the polycrystalline group III nitride layer from the deposition chamber is performed in a glove box without exposing the interior of the reactor to air.

10. The method of claim 1, wherein the halogen-containing gas comprises one or more of HCl and $Cl_2$.

11. The method of claim 1, further comprising a dopant precursor into at least one of the source chamber and the deposition chamber.

12. The method of claim 11, wherein the dopant precursor comprises at least one of $SiH_4$, $SiCl_4$, $GeH_4$, $GeCl_4$, $H_2O$, or $Mg(C_5H_5)_2$.

13. The method of claim 1, wherein at least the source chamber is baked to remove residual moisture or other contaminants prior to flowing the halogen-containing gas over the group III metal to form the group III metal halide.

14. The method of claim 1, further comprising adjusting the flow rate of the halogen-containing gas and the flow rate of the nitrogen-containing gas to achieve an efficiency with which the group III metal atoms are converted from an elemental state in the source chamber to polycrystalline group III nitride on the foil in the deposition chamber that is greater than 75%.

15. The method of claim 1, further comprising subjecting at least one surface of the formed polycrystalline group III nitride layer to one or more of scraping, scouring or scarifying.

16. The method of claim 1, further comprising subjecting one or more surfaces of the polycrystalline group III nitride to one or more of jaw crushing, ball milling, attrition milling, sieving, oxidation in air or in dry oxygen, heating in aqueous base, washing, sonicating, or annealing in an inert, nitriding, or reducing atmosphere.

17. The method of claim 16, wherein one or more of washing and sonicating is performed in one or more of organic solvents, acids, bases, hydrogen peroxide, o or other oxidizers.

18. The method of claim 3, wherein the polycrystalline group III nitride layer has a first surface that is in contact with a foil disposed over the deposition surface and a second surface that is opposite to the first surface, and the formed polycrystalline group III nitride layer is substantially free of pores that extend between the first surface and the second surface.

19. The method of claim 18, wherein the first surface of the polycrystalline group III nitride layer has a root-mean-square roughness that is less than a root-mean-square roughness of the second surface.

20. The method of claim 3, wherein an intermediate enclosure is disposed between the outer enclosure, and the source chamber and the deposition chamber.

21. The method of claim 20, wherein a path, along which the flowing of the purge gas through the third inlet line and into the space between the outer enclosure, the source chamber and the deposition chamber follows, comprises a space between the outer enclosure and the intermediate enclosure, a gap formed in the intermediate enclosure, and a space between the intermediate enclosure and the source chamber and the deposition chamber.

* * * * *

UNITED STATES PATENT AND TRADEMARK OFFICE
CERTIFICATE OF CORRECTION

PATENT NO. : 10,619,239 B2
APPLICATION NO. : 16/023137
DATED : April 14, 2020
INVENTOR(S) : Douglas W. Pocius et al.

Page 1 of 1

It is certified that error appears in the above-identified patent and that said Letters Patent is hereby corrected as shown below:

In the Specification

Column 1, Lines 9-10, delete "U.S. Provisional Application No. 61/109,498" and replace with -- U.S. Provisional Application No. 62/109,498 --

Signed and Sealed this
Twenty-eighth Day of July, 2020

Andrei Iancu
*Director of the United States Patent and Trademark Office*